US010859634B2

(12) United States Patent
Jung et al.

(10) Patent No.: US 10,859,634 B2
(45) Date of Patent: Dec. 8, 2020

(54) ENERGY STORAGE SYSTEM FOR VEHICLE

(71) Applicants: Hyundai Motor Company, Seoul (KR); Kia Motors Corporation, Seoul (KR)

(72) Inventors: In Sung Jung, Seoul (KR); Hee Sung Moon, Seoul (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 52 days.

(21) Appl. No.: 16/160,355

(22) Filed: Oct. 15, 2018

(65) Prior Publication Data
US 2019/0324090 A1   Oct. 24, 2019

(30) Foreign Application Priority Data
Apr. 23, 2018 (KR) .................. 10-2018-0046607

(51) Int. Cl.
*G01R 31/00* (2006.01)
*G01R 31/392* (2019.01)
*H01M 10/42* (2006.01)

(52) U.S. Cl.
CPC ......... *G01R 31/392* (2019.01); *H01M 10/425* (2013.01)

(58) Field of Classification Search
CPC .............. G01R 31/392; H01M 10/482; H01M 10/425; H01M 10/4207; H01M 2010/4271; H01M 10/70; H01M 2220/20; H02J 7/0013; H02J 7/34
See application file for complete search history.

(56) References Cited

U.S. PATENT DOCUMENTS

| | | | | |
|---|---|---|---|---|
| 6,773,849 B2* | 8/2004 | Itoh | ............... | H01M 10/0413 429/158 |
| 7,567,057 B2* | 7/2009 | Elder | ............... | B60L 3/0046 320/104 |
| 8,543,271 B2* | 9/2013 | Yamamoto | ............ | B60K 6/445 701/22 |
| 8,723,457 B2* | 5/2014 | Komatsu | ............... | B60L 58/20 318/139 |
| 8,798,832 B2* | 8/2014 | Kawahara | ........... | H01M 10/441 701/22 |

(Continued)

FOREIGN PATENT DOCUMENTS

KR   20160033526 A   3/2016

*Primary Examiner* — Naum Levin
(74) *Attorney, Agent, or Firm* — Mintz Levin Cohn Ferris Glovsky and Popeo, P.C.; Peter F. Corless

(57) ABSTRACT

An energy storage system for a vehicle is provided. The system includes a plurality of energy storage devices that are arranged to provide output power to a vehicle and are connected in parallel with each other. A plurality of sub-relays are connected to the plurality of energy storage devices, respectively. A controller then measures the degrees of deterioration of the respective energy storage devices and selectively opens or closes the sub-relays based on the amount of output power required for a vehicle and the measured degrees of deterioration such that a sub-relay connected to an energy storage device having a low degree of deterioration is closed first.

9 Claims, 3 Drawing Sheets

(56) References Cited

U.S. PATENT DOCUMENTS

| | | | | |
|---|---|---|---|---|
| 8,872,474 B2* | 10/2014 | Scheucher | | B60K 1/04 |
| | | | | 320/112 |
| 9,000,732 B2* | 4/2015 | Kim | | H02J 7/0021 |
| | | | | 320/162 |
| 9,046,585 B2* | 6/2015 | Sugeno | | G01R 31/3648 |
| 9,153,846 B2* | 10/2015 | Liang | | H01M 10/443 |
| 9,293,937 B2* | 3/2016 | Kawahara | | H01M 10/441 |
| 9,381,826 B2* | 7/2016 | Wu | | B60L 15/209 |
| 9,434,273 B2* | 9/2016 | Okamura | | B60L 50/40 |
| 9,537,329 B2* | 1/2017 | Pernyeszi | | H02J 7/0014 |
| 9,718,457 B2* | 8/2017 | Chen | | B60K 6/54 |
| 9,728,820 B2* | 8/2017 | Diamond | | B60L 58/16 |
| 9,979,210 B2* | 5/2018 | Takao | | H02J 7/0016 |
| 10,074,975 B2* | 9/2018 | Tsukamoto | | H02J 7/0024 |
| 10,099,683 B2* | 10/2018 | Lyons | | B60W 30/182 |
| 10,135,267 B2* | 11/2018 | Sasaki | | B60L 58/14 |
| 10,270,264 B2* | 4/2019 | Yoon | | H02J 7/00 |
| 10,290,912 B2* | 5/2019 | Jiang | | B60L 3/04 |
| 10,291,037 B2* | 5/2019 | Birkl | | H02J 7/0008 |
| 10,340,707 B2* | 7/2019 | Hinterberger | | H02J 7/0024 |
| 10,404,077 B2* | 9/2019 | Hwang | | H02J 7/0014 |
| 10,431,996 B2* | 10/2019 | Liu | | H02J 7/0014 |
| 10,473,726 B2* | 11/2019 | Park | | G01R 31/396 |
| 10,497,988 B2* | 12/2019 | Oh | | H02J 7/0013 |
| 10,532,647 B2* | 1/2020 | Colavincenzo | | B60K 6/26 |
| 2006/0137918 A1* | 6/2006 | Dinser | | H02J 7/14 |
| | | | | 180/65.1 |
| 2009/0105895 A1* | 4/2009 | Shige | | B60W 10/26 |
| | | | | 701/22 |
| 2010/0121511 A1* | 5/2010 | Onnerud | | H02J 7/0014 |
| | | | | 701/22 |
| 2011/0087395 A1* | 4/2011 | Yamamoto | | B60K 6/445 |
| | | | | 701/22 |
| 2012/0237799 A1* | 9/2012 | Jiang | | B60L 50/64 |
| | | | | 429/7 |
| 2013/0106354 A1* | 5/2013 | Suzuki | | H02J 7/0016 |
| | | | | 320/116 |
| 2016/0105054 A1* | 4/2016 | Horito | | H01M 10/425 |
| | | | | 320/134 |
| 2016/0218525 A1* | 7/2016 | Takao | | H02J 7/0016 |
| 2016/0294019 A1* | 10/2016 | Yamauchi | | G01R 31/392 |
| 2017/0047603 A1* | 2/2017 | Kazuno | | H01M 8/04873 |
| 2017/0263956 A1* | 9/2017 | We | | H01M 8/04604 |
| 2017/0349048 A1* | 12/2017 | Nakayama | | B60L 1/003 |
| 2018/0264968 A1* | 9/2018 | Molina | | B60L 58/22 |
| 2018/0342881 A1* | 11/2018 | Schmitz | | H02J 7/0024 |
| 2019/0250903 A1* | 8/2019 | Seki | | B60R 16/03 |

* cited by examiner

US 10,859,634 B2

ENERGY STORAGE SYSTEM FOR VEHICLE

CROSS REFERENCE TO RELATED APPLICATION

The present application claims priority to Korean Patent Application No. 10-2018-0046607, filed Apr. 23, 2018, the entire contents of which is incorporated herein for all purposes by this reference.

BACKGROUND

1. Field of the Disclosure

The present disclosure relates to an energy storage system for a vehicle and, more particularly, to an energy storage system for a vehicle, which maintains the degrees of deterioration to be the same between respective energy storage devices connected in parallel with each other.

2. Description of the Prior Art

In general, electric vehicles, hybrid vehicles, and plug-in hybrid vehicles are equipped with a high-voltage battery for storing electric energy to be supplied for driving force of the vehicle. The high-voltage battery supplies most of the energy used by the vehicle, and thus the mileage of the vehicle may significantly vary depending on the capacity and condition of the high-voltage battery. When the high-voltage battery is used continuously, the capacity of the battery is reduced due to a deterioration phenomenon resulting from its own characteristics. When the deterioration phenomenon of the battery continuously progresses, even when the battery gauge indicates the same state of charge (SOC), the mileage of the vehicle is reduced or the output power for acceleration is decreased.

On the other hand, an electric vehicle or the like is equipped with a battery in the form of a pack in which a plurality of high-voltage batteries are connected in parallel with each other, and the degrees of deterioration of the plurality of high-voltage batteries are measured, thereby operating the entire battery system according to the measured degrees of deterioration. However, in the prior art, when the degree of deterioration of a specific battery, among the plurality of high-voltage batteries, is high, the performance factor (e.g., output power) of the entire battery was calculated based on the battery having the high degree of deterioration. As a result, the calculated performance factor value is less than the actual performance factor value of the entire battery. In addition, the performance and life span of the entire battery deteriorated.

It should be understood that the foregoing description of the background art is merely for the purpose of promoting an understanding of the background of the present disclosure, and it should not be construed as an admission that the description is regarded as a prior art known to those skilled in the art.

SUMMARY

The present disclosure provides an energy storage system for a vehicle, which measures the degree of deterioration of each of a plurality of energy storage devices and which selectively opens or closes sub-relays based on the amount of output power required for a vehicle and the measured degree of deterioration to first close a sub-relay connected to an energy storage device having a relatively low degree of deterioration, thereby maintaining the degrees of deterioration to be equal between a plurality of energy storage devices, improving the performance of the entire energy storage device according thereto, and increasing the life span of the energy storage device.

In accordance with an aspect of the present disclosure, an energy storage system for a vehicle may include: a plurality of energy storage devices arranged to provide output power to the vehicle and connected in parallel with each other; a plurality of sub-relays connected to the plurality of energy storage devices, respectively; and a controller configured to measure the degree of deterioration of each of the plurality of energy storage devices and selectively open or close the sub-relays based on the amount of output power required for a vehicle and the measured degrees of deterioration.

The controller, based on the measured degrees of deterioration, may be configured to first close a sub-relay, which is connected to an energy storage device having a relatively low degree of deterioration. Additionally, the controller may be configured to measure the degrees of deterioration of the respective energy storage devices to extract the difference in the degrees of deterioration between the energy storage devices, compare the extracted difference in the degrees of deterioration with a predetermined reference value, and close a specific sub-relay, among the plurality of sub-relays, based on a result value of the comparison and the amount of output power required for a vehicle.

During a vehicle startup, when the difference in the measured degrees of deterioration between the energy storage devices is equal to or greater than a predetermined reference value, and the amount of output power required for a vehicle is less than a predetermined reference value, the controller may be configured to close a sub-relay to which an energy storage device having the lowest measured degree of deterioration is connected, among the plurality of energy storage devices. Additionally, when the difference in the measured degrees of deterioration between the energy storage devices is less than a predetermined reference value, and the amount of output power required for a vehicle is equal to or greater than a predetermined reference value, the controller may be configured to close sub-relays to which the plurality of energy storage devices are connected.

While the vehicle is being operated, when the difference in the degrees of deterioration between the energy storage devices is less than a predetermined reference value, and the voltage difference between the energy storage devices is less than a predetermined reference value, the controller may be configured to close a plurality of sub-relays connected to the remaining energy storage devices, except for the sub-relay to which the energy storage device having the lowest degree of deterioration is connected. The energy storage system may further include a main relay commonly connected to the plurality of sub-relays, and the main relay may be closed when at least one of the plurality of sub-relays is closed.

The controller may further be configured to measure the degrees of deterioration of the respective energy storage devices while charging to extract the difference in the degrees of deterioration between the energy storage devices, compare the extracted difference in the degrees of deterioration with a predetermined reference value, and close a specific sub-relay, among the plurality of sub-relays, based on a result value of the comparison. During charging, when the difference in the measured degrees of deterioration between the energy storage devices is equal to or greater than a predetermined reference value, the controller may be configured to close a sub-relay to which the energy storage device having the lowest degree of deterioration is connected, among the plurality of energy storage devices, to allow the corresponding energy storage device to be charged.

Additionally, during charging, when the difference in the degrees of deterioration between the energy storage devices is less than a predetermined reference value, and the voltage difference between the energy storage devices is less than a predetermined reference value, the controller may be configured to close the plurality of sub-relays connected to the remaining energy storage devices, respectively, except for the sub-relay to which the energy storage device having the lowest degree of deterioration is connected, to allow the remaining energy storage devices to be charged.

When the degree of deterioration of a specific energy storage device exceeds a predetermined reference value while running, the controller may be configured to open a sub-relay to which the corresponding energy storage device is connected. When the degree of deterioration of a specific energy storage device exceeds a predetermined reference value while charging, the controller may be configured to open a sub-relay to which the corresponding energy storage device is connected.

According to the present disclosure, it may be possible to maintain the degrees of deterioration to be equal between a plurality of energy storage devices, to improve the performance of the entire energy storage device according thereto, and to increase the life span of the energy storage device by measuring the degrees of deterioration of respective energy storage devices and by selectively opening or closing sub-relays based on the amount of output power required for a vehicle and the measured degrees of deterioration to close a sub-relay connected to an energy storage device having a relatively low degree of deterioration first.

BRIEF DESCRIPTION OF THE DRAWINGS

The above and other aspects, features, and advantages of the present disclosure will be more apparent from the following detailed description taken in conjunction with the accompanying drawings, in which.

DETAILED DESCRIPTION

Figure 1:
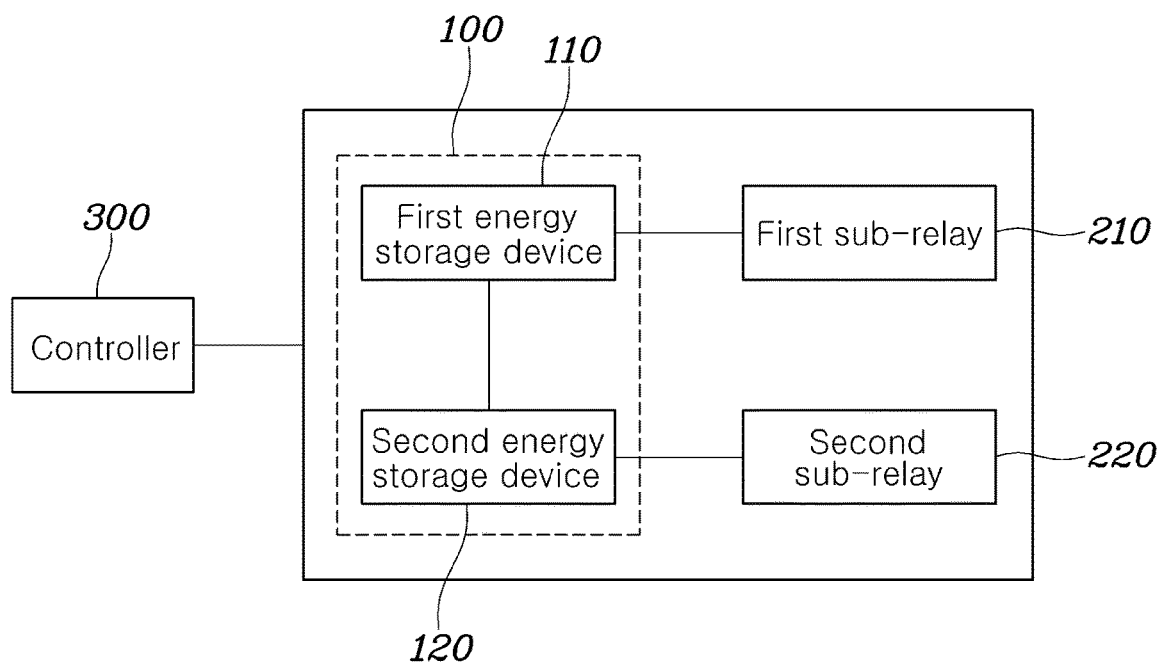
FIG. 1 is a schematic view illustrating the overall configuration of an energy storage system for a vehicle according to an exemplary embodiment of the present disclosure.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referral to herein, a hybrid vehicle is a vehicle that has two or more sources of power, for example both gasoline-powered and electric-powered vehicles.

Although exemplary embodiment is described as using a plurality of units to perform the exemplary process, it is understood that the exemplary processes may also be performed by one or plurality of modules. Additionally, it is understood that the term controller/control unit refers to a hardware device that includes a memory and a processor. The memory is configured to store the modules and the processor is specifically configured to execute said modules to perform one or more processes which are described further below.

Furthermore, control logic of the present disclosure may be embodied as non-transitory computer readable media on a computer readable medium containing executable program instructions executed by a processor, controller/control unit or the like. Examples of the computer readable mediums include, but are not limited to, ROM, RAM, compact disc (CD)-ROMs, magnetic tapes, floppy disks, flash drives, smart cards and optical data storage devices. The computer readable recording medium can also be distributed in network coupled computer systems so that the computer readable media is stored and executed in a distributed fashion, e.g., by a telematics server or a Controller Area Network (CAN).

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/of" includes any and all combinations of one or more of the associated listed items.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

Hereinafter, an energy storage system for a vehicle, according to an exemplary embodiment of the present disclosure, will be described with reference to the accompanying drawings. In the present disclosure, an energy storage device may be a device for storing energy, which includes a battery, a supercapacitor, and the like. In the following description and drawings, it is assumed that the energy storage device is a battery.

Figure 2:
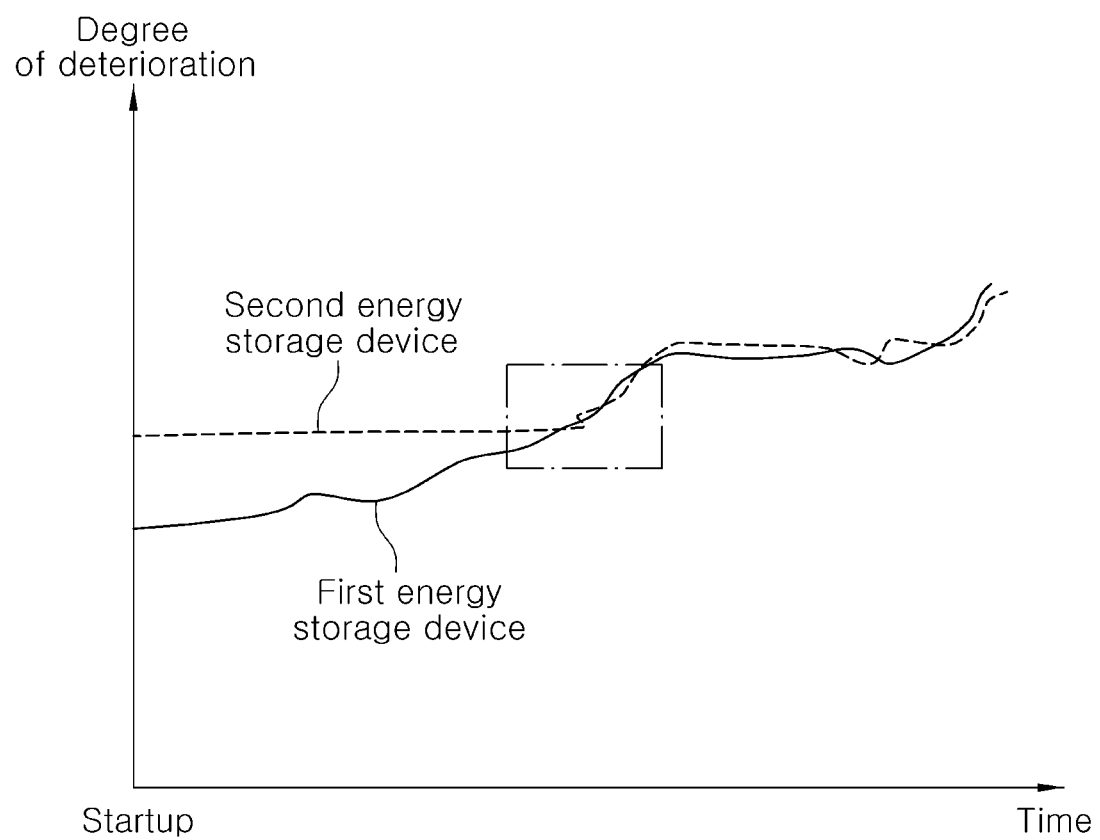
FIG. 2 is a graph illustrating changes in the degrees of deterioration of a first energy storage device and a second energy storage device depending on time in an energy storage system for a vehicle according to an exemplary embodiment of the present disclosure.
Figure 3:
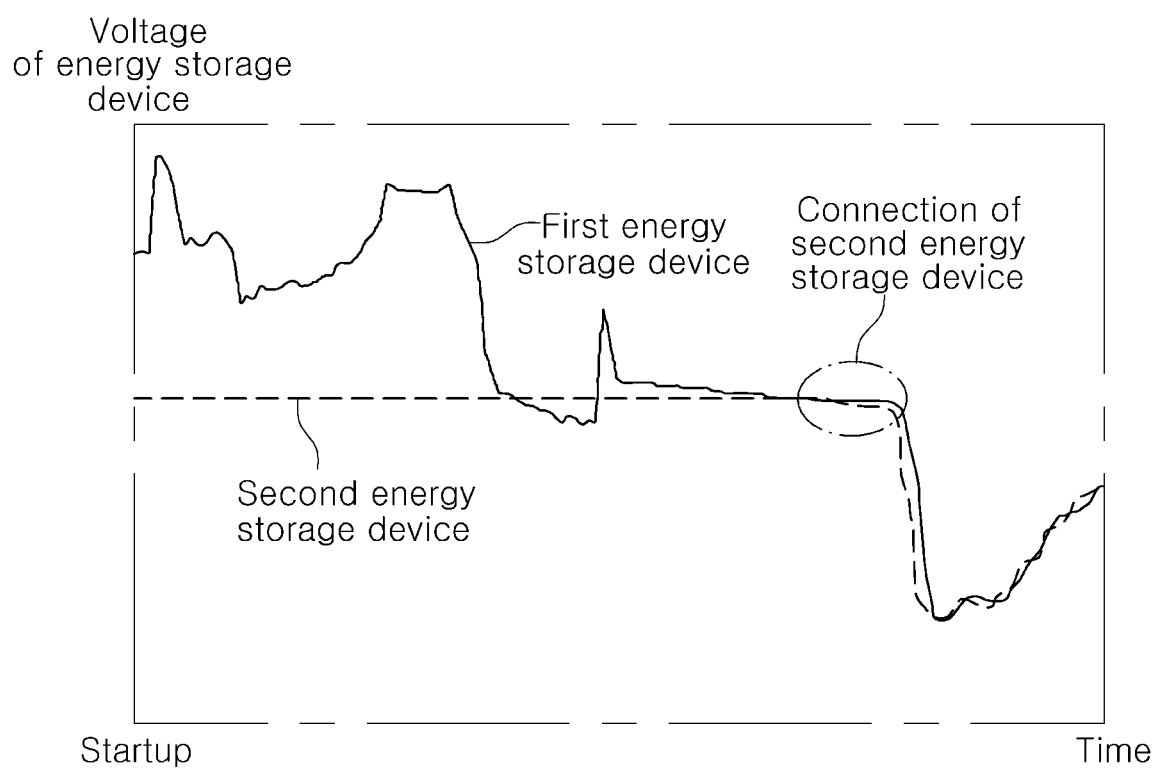
FIG. 3 is a graph illustrating a change in the voltage difference between a first energy storage device and a second energy storage device depending on time in an energy storage system for a vehicle according to an exemplary embodiment of the present disclosure.

FIG. 1 is a schematic view illustrating the overall configuration of an energy storage system for a vehicle according to an exemplary embodiment of the present disclosure. FIG. 2 is a graph illustrating changes in the degrees of deterioration of a first energy storage device and a second energy storage device depending on time in an energy storage system for a vehicle according to an exemplary embodiment of the present disclosure. FIG. 3 is a graph illustrating a change in the voltage difference between a first energy storage device and a second energy storage device depending on time in an energy storage system for a vehicle according to an exemplary embodiment of the present disclosure.

As shown in FIG. 1, the energy storage system for a vehicle, according to an exemplary embodiment of the present disclosure may include an energy storage device 100, a sub-relay 200, and a controller 300. Hereinafter, a concrete configuration and features of the energy storage system for a vehicle according to the present disclosure will be described in more detail. In particular, the energy storage device 100 may be configured to provide an output power to a vehicle, and a plurality of high-voltage energy storage devices may be connected in parallel with each other to form a single pack. The number of energy storage devices, which are connected in parallel with each other to form the energy storage device 100 in the form of a pack, is not limited to a specific number, and the following description will be made of an energy storage device of a pack including two energy storage devices (a first energy storage device 110 and a second energy storage device 120) as shown in FIG. 1.

The sub-relay 200 may be connected to the first energy storage device 110 and the second energy storage device 120, respectively, and may be opened or closed by the controller 300, based on the amount of output power required for a vehicle and the measured degrees of deterioration of the first energy storage device 110 and the second energy storage device 120. According to an exemplary embodiment, as shown in FIG. 1, when the energy storage device 100 includes the first energy storage device 110 and the second energy storage device 120, the sub-relay 200 may include a first sub-relay 210 connected to the first energy storage device 110 and a second sub-relay 220 connected to the second energy storage device 120.

Meanwhile, the energy storage system for a vehicle according to the present disclosure may further include a main relay (not shown) commonly connected to a plurality of sub-relays. When at least one of the plurality of sub-relays is closed, the main relay may also be closed. In other words, when at least one of the sub-relays is closed, the main relay may be closed to allow the energy storage device connected to the corresponding sub-relay to provide output power. According to an exemplary embodiment, a plurality of sub-relays and the main relay may be connected via an OR-GATE, and thus, when one of the plurality of sub-relays is closed, the main relay may be automatically closed.

The controller 300 may be configured to measure the degrees of deterioration of the respective energy storage devices. According to an exemplary embodiment, to measure the degree of deterioration of the energy storage device, the controller 300 may connect a separate internal-resistance measuring device configured to measure the internal-resistance of the energy storage device, to the energy storage device, thereby measuring the internal resistance. According to another exemplary embodiment, the controller 300 may be configured to estimate the internal resistance using a modeling analysis of an output voltage to an input current of the energy storage device, thereby estimating the degree of deterioration of the energy storage device based on the degree of increment of the internal resistance. However, this is merely an exemplary embodiment, and the method for measuring the degrees of deterioration of the respective energy storage devices through the controller 300 is not limited to a specific method in the present disclosure.

In addition, based on the amount of output power required for a vehicle and the measured degrees of deterioration of the energy storage devices, the controller 300 may be configured to selectively open or close the sub-relays to thus first close a sub-relay connected to the energy storage device having a relatively low degree of deterioration. In other words, based on the amount of output power required for a vehicle and the measured degrees of deterioration of the respective energy storage devices, the controller 300 may be configured to sequentially close the sub-relays in the order from the sub-relay, to which the energy storage device having a low degree of deterioration is connected, to the sub-relay, to which the energy storage device having a high degree of deterioration is connected. Accordingly, it may be possible to maintain the degrees of deterioration to be equal between the plurality of energy storage devices, thereby improving the performance of the entire energy storage device and increasing the life span of the energy storage device.

In particular, the controller 300 may be configured to measure the degrees of deterioration of respective energy storage devices to thus extract the difference in the degrees of deterioration between the energy storage devices, compare the extracted difference in the degrees of deterioration with a predetermined reference value, and close a specific sub-relay, among a plurality of sub-relays, based on a result value of the comparison and the amount of output power required for a vehicle. In other words, the controller 300 may be configured to measure the degrees of deterioration of the respective energy storage devices at every startup (e.g., vehicle startup).

When the difference in the degrees of deterioration between the energy storage devices, which are measured during vehicle startup, is equal to or greater than a predetermined reference value, and the amount of output power required for a vehicle is less than a predetermined reference value, the controller 300 may be configured to close a sub-relay to which an energy storage device having a lowest measured degree of deterioration is connected, among a plurality of energy storage devices, such that the energy storage device having the lowest degree of deterioration provides output power. In particular, the amount of output power required for a vehicle may vary depending on the driving mode of a vehicle.

For example, when the driving mode of a vehicle is an eco-mode in which high output power is not required, the amount of output power required for a vehicle may be less than that in a normal mode, and the amount of output power required for a vehicle in the normal mode may be less than that in a sports mode in which high output power is required. In other words, according to an exemplary embodiment, when the difference in the degrees of deterioration between the energy storage devices, which are measured during vehicle startup, is equal to or greater than a predetermined reference value, and when the eco-mode, which does not require high output power, is set, the controller 300 may be configured to close only a sub-relay to which an energy storage device having a lowest degree of deterioration is connected and thus, only the corresponding energy storage device provides output power. The configuration in which only the energy storage device having a lowest degree of deterioration provides output power is intended to increase the degree of deterioration of the corresponding energy storage device using the energy storage device having the lowest degree of deterioration, thereby maintaining the degree of deterioration thereof to be similar to that of other energy storage devices.

In addition, according to an exemplary embodiment, when the difference in the degrees of deterioration between the energy storage devices, which are measured during vehicle startup, is less than a predetermined reference value, and the amount of output power required for a vehicle is equal to or greater than a predetermined reference value, the controller 300 may be configured to close sub-relays to which a plurality of energy storage devices are connected and thus, the plurality of energy storage devices provide output power. In other words, when the measured degrees of deterioration of the respective energy storage devices are similar to each other, and a sports mode or the like, which requires high output power, is set, the controller 300 may be configured to close all of the sub-relays to which a plurality of energy storage devices are connected and thus, the plurality of energy storage devices provide output power.

Further, when the amount of output power required for a vehicle varies while the vehicle is being operated, the controller 300 may be configured to open or close the sub-relays to provide output power corresponding thereto. For example, when the difference in the degrees of deterioration between the energy storage devices, which are measured during startup, is less than a predetermined reference value, and when only the energy storage device having a lowest degree of deterioration provides output power due to an eco-mode that does not require high output power being set, if the amount of output power required for a vehicle is changed such as a sports mode in which high output power is required, the controller 300 may be configured to close sub-relays connected to the remaining energy storage devices, except for a sub-relay connected to the energy storage device having the lowest degree of deterioration, and thus, a plurality of energy storage devices provide output power.

Meanwhile, when the difference in the degrees of deterioration between the energy storage devices is less than a predetermined reference value while the vehicle is being operated, and the voltage difference between the energy storage devices is less than a predetermined reference value, the controller 300 may be configured to close a plurality of sub-relays connected to the remaining energy storage devices, except for the sub-relay to which the energy storage device having the lowest degree of deterioration is connected, during startup and thus, a plurality of energy storage devices provide output power.

In particular, when the controller 300 closes the remaining sub-relays, except for the sub-relay to which the energy storage device having the lowest degree of deterioration is connected, the controller 300 may be configured to sequentially close the sub-relays from the sub-relay to which the energy storage device having the lowest degree of deterioration is connected. In addition, when the degree of deterioration of a specific energy storage device exceeds a predetermined reference value while running, the controller 300 may be configured to open the sub-relay to which the corresponding energy storage device is connected, thereby cutting off the output power from the corresponding energy storage device.

Hereinafter, the operation of an energy storage system for a vehicle according to the present disclosure during startup and operation will be described in more detail with reference to FIGS. 2 and 3.

According to an exemplary embodiment, as shown in FIG. 2, when the degree of deterioration of the first energy storage device 110, which is measured during startup of the vehicle, is less than the degree of deterioration of the second energy storage device 120, and when an eco-mode that does not require high output power is set, the controller 300 may be configured to close only the first sub-relay 210 connected to the first energy storage device 110 and thus, only the first energy storage device 110 may be capable of providing output power. When the vehicle is driven for a predetermined period of time while the output power is supplied only from the first energy storage device 110 as described above, the degree of deterioration of the first energy storage device 110 increases with the lapse of time, and thus, the difference in the degree of deterioration between the first energy storage device 110 and the second energy storage device 120 becomes less than a predetermined reference value, as shown in FIG. 2.

In addition, as shown in FIG. 3, the voltage difference between the first energy storage device 110 and the second energy storage device 120 becomes less than a predetermined reference value as time passes. While the vehicle is being operated, when the difference in the degree of deterioration between the first energy storage device 110 and the second energy storage device 120 becomes less than a predetermined reference value, and the voltage difference between the two energy storage devices becomes less than a predetermined reference value, the controller 300 may be configured to close the second sub-relay 220 to which the second energy storage device 120 is connected and thus, the first energy storage device 110 and the second energy storage device 120 may supply output power.

Furthermore, the controller 300 may be configured to measure the degrees of deterioration of the respective energy storage devices while charging to then extract the difference in the degrees of deterioration between the energy storage devices, compare the extracted difference in the degrees of deterioration with a predetermined reference value, and close a specific sub-relay, among a plurality of sub-relays, based on a result value of the comparison. In particular, the controller 300 may be configured to measure the degrees of deterioration of the respective energy storage devices during charging, and when the difference in the measured degrees of deterioration between the energy storage devices is equal to or greater than a predetermined reference value, the controller 300 may be configured to close a sub-relay to which the energy storage device having a lowest measured degree of deterioration is connected, among the plurality of energy storage devices, to thus charge the corresponding energy storage device.

On the other hand, during charging, when the difference in the degrees of deterioration between the energy storage devices is less than a predetermined reference value, and the voltage difference between the energy storage devices is less than a predetermined reference value, the controller 300 may be configured to close a plurality of sub-relays connected to the remaining energy storage devices, except for a sub-relay to which the energy storage device having a lowest degree of deterioration is connected, to thus charge the remaining energy storage devices. In addition, when the degree of deterioration of a specific energy storage device exceeds a predetermined reference value during charging, the controller 300 may be configured to open the sub-relay to which the corresponding energy storage device is connected, thereby preventing the corresponding energy storage device from being charged.

As described above, according to the present disclosure, it may be possible to maintain the degrees of deterioration to be equal between a plurality of energy storage devices, to improve the performance of the entire energy storage device according thereto, and to increase the life span of the energy storage device by measuring the degrees of deterioration of the respective energy storage devices and by selectively opening or closing sub-relays based on the amount of output power required for a vehicle and the measured degrees of deterioration to thus first close a sub-relay connected to an energy storage device having a relatively low degree of deterioration.

What is claimed is:

1. An energy storage system for a vehicle, comprising:
a plurality of energy storage devices arranged to provide output power to the vehicle and connected in parallel with each other;
a plurality of sub-relays connected to the plurality of energy storage devices, respectively; and
a controller configured to measure degrees of deterioration of the respective energy storage devices and selectively open or close the sub-relays based on an amount of output power required for the vehicle and the measured degrees of deterioration,
wherein when the amount of power required by the vehicle changes from an eco-mode that does not require high output power to a sports mode that requires the high output power while the vehicle is being operated, the controller is configured to close sub-relays connected to the remaining energy storage devices to provide the output power corresponding to the high output power,
wherein during vehicle startup, when the difference in the measured degrees of deterioration between the energy storage devices is equal to or greater than a predetermined reference value, and the amount of output power required for a vehicle is less than a predetermined reference value, the controller is configured to close a sub-relay to which an energy storage device having a lowest measured degree of deterioration is connected, among the plurality of energy storage devices,
wherein the controller is configured to measure the degrees of deterioration of the respective energy storage devices during charging to extract the difference in the degrees of deterioration between the energy storage devices, and
wherein when the difference in the measured degrees of deterioration between the energy storage devices is equal to or greater than a predetermined reference value while charging, the controller is configured to close a sub-relay to which the energy storage device having a lowest degree of deterioration is connected, among the plurality of energy storage devices, to charge the corresponding energy storage device.

2. The energy storage system of claim 1, wherein the controller, based on the measured degrees of deterioration, is configured to first close a sub-relay which is connected to an energy storage device having a low degree of deterioration.

3. The energy storage system of claim 1, wherein the controller is configured to measure the degrees of deterioration of the respective energy storage devices to extract the difference in the degrees of deterioration between the energy storage devices, compare the extracted difference in the degrees of deterioration with a predetermined reference value, and close a specific sub-relay, among the plurality of sub-relays, based on a result value of the comparison and the amount of output power required for the vehicle.

4. The energy storage system of claim 3, wherein, during vehicle startup, when the difference in the measured degrees of deterioration between the energy storage devices is less than a predetermined reference value, and the amount of output power required for a vehicle is equal to or greater than a predetermined reference value, the controller is configured to close sub-relays to which the plurality of energy storage devices are connected.

5. The energy storage system of claim 1, wherein, while the vehicle is being operated, when the difference in the degrees of deterioration between the energy storage devices becomes less than a predetermined reference value, and the voltage difference between the energy storage devices becomes less than a predetermined reference value, the controller is configured to close a plurality of sub-relays connected to the remaining energy storage devices, respectively, except for the sub-relay to which the energy storage device having the lowest degree of deterioration is connected.

6. The energy storage system of claim 5, wherein when the degree of deterioration of a specific energy storage device exceeds a predetermined reference value while the vehicle is being operated, the controller is configured to open a sub-relay to which the corresponding energy storage device is connected.

7. The energy storage system of claim 1, further comprising:
a main relay commonly connected to the plurality of sub-relays,
wherein the main relay is closed when at least one of the plurality of sub-relays is closed.

8. The energy storage system of claim 1, wherein, during charging, when the difference in the degrees of deterioration between the energy storage devices becomes less than a predetermined reference value, and the voltage difference between the energy storage devices becomes less than a predetermined reference value, the controller is configured to close the plurality of sub-relays connected to the remaining energy storage devices, respectively, except for the sub-relay to which the energy storage device having the lowest degree of deterioration is connected, to charge the remaining energy storage devices.

9. The energy storage system of claim 1, wherein when the degree of deterioration of a specific energy storage device exceeds a predetermined reference value during charging, the controller is configured to open a sub-relay to which the corresponding energy storage device is connected.

* * * * *